(12) United States Patent  (10) Patent No.: US 9,153,736 B2
Chou et al.  (45) Date of Patent: Oct. 6, 2015

(54) LIGHT-EMITTING DIODE DEVICE AND METHOD FOR FABRICATING THE SAME

(71) Applicant: LEXTAR ELECTRONICS CORPORATION, Hsinchu (TW)

(72) Inventors: Hsiu-Mei Chou, Hsinchu (TW); Jui-Yi Chu, Taichung (TW); Cheng-Ta Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/298,826

(22) Filed: Jun. 6, 2014

(65) Prior Publication Data

US 2015/0214431 A1 Jul. 30, 2015

(30) Foreign Application Priority Data

Jan. 24, 2014 (TW) .............................. 103102586 A (51) Int. Cl.
*H01L 33/14* (2010.01)
*H01L 21/266* (2006.01)
*H01L 33/22* (2010.01)
*H01L 33/06* (2010.01)
*H01L 33/02* (2010.01)

(52) U.S. Cl.
CPC ............ *H01L 33/145* (2013.01); *H01L 33/025* (2013.01); *H01L 33/06* (2013.01); *H01L 33/22* (2013.01)

(58) Field of Classification Search
None
See application file for complete search history.

(56) References Cited

U.S. PATENT DOCUMENTS

2012/0256164 A1* 10/2012 Chen et al. ...................... 257/13
2013/0234149 A1*  9/2013 Halderman et al. ............ 257/76
2014/0183448 A1*  7/2014 Krishnamoorthy et al. .... 257/13

* cited by examiner

*Primary Examiner* — Joseph Schoenholtz (57) ABSTRACT

The invention provides a light-emitting diode device and a method for fabricating the same. The light-emitting diode device includes a metal substrate. A light-emitting diode structure is bonded on the metal substrate. The light-emitting diode structure includes a first type semiconductor substrate and a second type semiconductor layer. The first type semiconductor layer has a first surface and a second surface opposite to the first surface. The second type semiconductor layer is in contact with the metal substrate. A light-emitting layer is disposed between the first type semiconductor substrate and the second type semiconductor layer. A portion of the second surface and a sidewall adjacent to the second surface are uneven roughened surfaces.

18 Claims, 11 Drawing Sheets

LIGHT-EMITTING DIODE DEVICE AND METHOD FOR FABRICATING THE SAME

CROSS REFERENCE TO RELATED APPLICATIONS

This application claims priority of Taiwan Patent Application No. 103102586, filed on Jan. 24, 2014, the entirety of which is incorporated by reference herein.

BACKGROUND OF THE INVENTION

1. Field of the Invention

The present invention relates to a light-emitting diode (LED) device and a method for fabricating the same, and in particular it relates to a vertical LED device and a method for fabricating the same.

2. Description of the Related Art

Light-emitting diodes (LEDs) have two configurations. The LED that has electrodes arranged on the same side of an LED chip is called a horizontal LED. The LED that has electrodes arranged on the opposite sides of an LED chip is called a vertical LED. A current path flowing in and out of a semiconductor light-emitting layer of the horizontal LED needs to be turned in a direction horizontal to the LED chip. A current path can flow in and out of a semiconductor light-emitting layer of the vertical LED without turning in different directions.

The horizontal LED has disadvantages of hot spots and non-uniform current density due to the turned current path, so that the area of the horizontal LED is hard to be increased. In comparison, the vertical LED does not have over-heat portions (hot spots) or dark portions due to the uniform current density. Therefore, the area of the vertical LED could be increased. The LED chip of the LED device usually grows on a substrate wafer by an epitaxial growth method. In fabrication processes for LED devices, however, the substrate wafer needs to be cut to fabricate the individual LED chips for epitaxial layers to grow on. The loss due to the substrate wafer sawing process is high when the LED chips have a small area, and this leads to the total light-emitting area of the substrate wafer to be reduced. Also, a portion of the light-emitting layer of the horizontal LED is used for an electrode formed thereon. Therefore, the fabrication cost per light-emitting area of the vertical LED is lower than that of the horizontal LED. The vertical LEDs are usually designed as high-illumination LEDs. Additionally, the vertical LEDs have a current flow from top to bottom, which is different from a current flow in the horizontal LED. The spreading area of the current flowing in the vertical LEDs is larger and more uniform that the horizontal LED. Further, a sapphire carrier lift-off process, is required to be adopted in the conventional fabrication processes of the LED device. The sapphire carrier removal process is too complex to control the fabrication cost and yield.

Thus, a novel LED device and a method for fabricating the same are desired.

BRIEF SUMMARY OF THE INVENTION

A light-emitting diode (LED) device and a method for fabricating the same are provided. An exemplary embodiment of the method for fabricating an LED device includes providing a first-type semiconductor substrate having a first surface and a second surface opposite to the first surface. A light-emitting layer and a second-type semiconductor layer are grown on the first surface of the first-type semiconductor substrate in sequence to form a light-emitting diode structure. A metal substrate is provided for the light-emitting diode structure to bond on through the second-type semiconductor layer. A first mask pattern is formed on a portion of the second surface of the first-type semiconductor substrate. A plurality of metal nano balls is formed on the second surface of the first-type semiconductor substrate not covered by the first mask pattern. A three-dimensional implantation process is performed using the first mask pattern and the plurality of metal nano balls collectively as a mask, so that a dopant is implanted into the first-type semiconductor substrate through the second surface and a sidewall adjacent to the second surface, which are not covered by the first mask pattern and the plurality of metal nano balls. The first mask pattern and the plurality of metal nano balls are removed. A conductive pattern is formed on the second surface of the first-type semiconductor substrate.

An exemplary embodiment of the light-emitting diode device includes a metal substrate. A light-emitting diode structure is bonded on the metal substrate. The light-emitting diode structure includes a first-type semiconductor layer, a second-type semiconductor and a light-emitting layer. The first-type semiconductor layer has a first surface and a second surface opposite to the first surface. The second-type semiconductor is in contact with the metal substrate. A light-emitting layer is disposed between the first-type semiconductor layer and the second-type semiconductor layer. A portion of the second surface and a sidewall adjacent to the second surface are concave-convex roughened surfaces.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Embodiments provide a method for fabricating a light-emitting diode (LED) device. In some embodiments, the LED device includes a vertical LED device. The method for fabricating an LED device uses a fabricated n-type semiconductor (e.g. GaN) substrate rather than the conventional sapphire substrate to form an LED structure by an epitaxy process. Compared with the conventional LED processes, one embodiment of a method for fabricating an LED device is performed without any lift-off process to lift off the sapphire carrier. Also, the method can control the thickness of the n-type semiconductor substrate to increase the process window of an etching process performed on at least five surfaces, which includes four sidewalls and a top surface used for an n-type contact, of the n-type semiconductor substrate. Additionally, the method uses metal nano balls arranged as an mask for a three-dimensional (3D) implantation process and a chemical etching process to perform a surface-roughing process for the at least five surfaces of the n-type semiconductor substrate. The surface-roughing process can destroy a smooth surface of the LED structure to increase the light-emitting efficiency of the LED device.

FIGS. 1-3, 4A, 5, 6, 7A, 8A, 9, 10, 11, 12A, 12B are schematic cross-sectional views of one embodiment of a method for fabricating an LED device of the invention. First, a finished first-type semiconductor substrate 200 is provided. The first-type semiconductor substrate 200 has a first surface 204 and a second surface 202 opposite to the first surface 204. It should be noted that the terms "first-type" and "second-type" in the description hereinafter are used to describe the conduction type of a semiconductor layer. The first-type is opposite to the second-type. For example, if the first-type is n-type, the second-type is p-type. Alternatively, if the first-type is p-type, the second-type is n-type. In this embodiment, the first-type semiconductor substrate 200 may be formed of semiconductor materials including GaN, GaP, GaAsP, AlGaAs, InGaAlP or InGaN. In one embodiment, the first-type semiconductor substrate 200 is a finished semiconductor substrate but not a semiconductor substrate grown by an epitaxy process. Therefore, the thickness of the first-type semiconductor substrate 200 may be between about 2 um-150 um.

Figure 1:
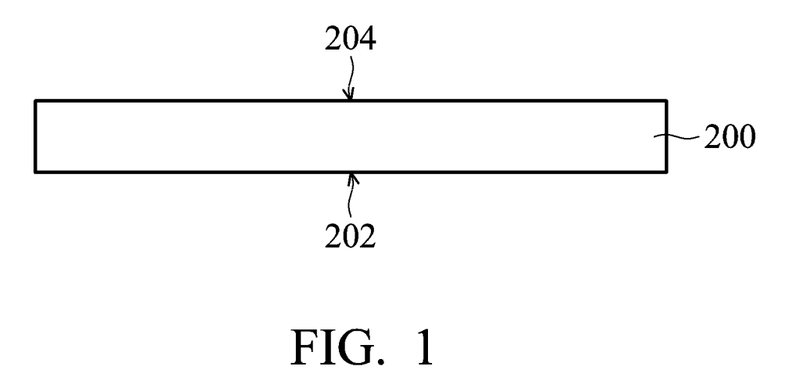
FIGS. 1-3, 4A, 5, 6, 7A, 8A, 9, 10, 11, 12A, 12B are schematic cross-sectional views of one embodiment of a method for fabricating a light-emitting diode device of the invention.
Figure 2:
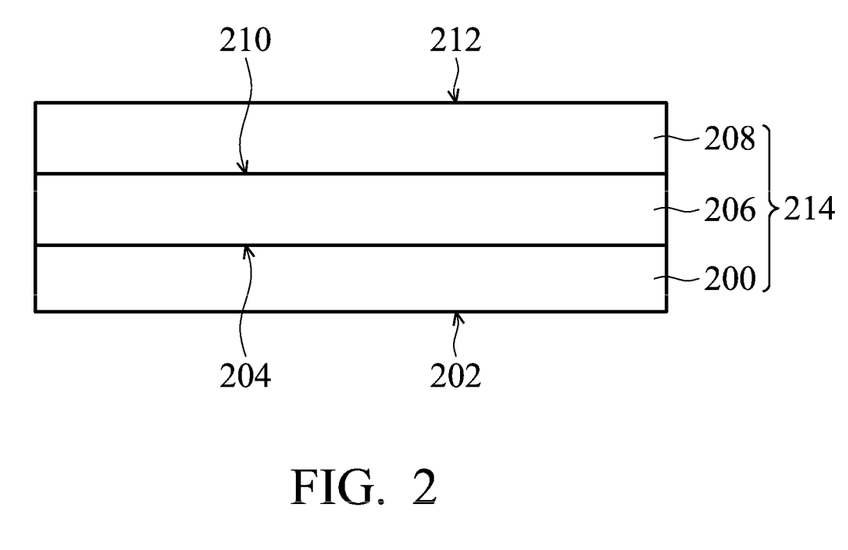

Next, a light-emitting layer 206 and a second-type semiconductor layer 208 are grown on the first surface 204 of the first-type semiconductor substrate 200 in sequence by thin-film deposition methods including a metal-organic chemical vapor deposition (MOCVD) or molecular beam epitaxy (MBE) process as shown in FIG. 2. In one embodiment, the light-emitting layer 206 is grown directly on the first-type semiconductor substrate 200 and in direct contact with the first-type semiconductor substrate 200. That is to say, the first-type semiconductor substrate 200 is not separated from the light-emitting layer 206 by layers, such as un-doped semiconductor layers or other layers. Additionally, in one embodiment, the second-type semiconductor layer 208 is grown directly on the light-emitting layer 206. That is to say, a second surface 210 opposite a first surface 212 of the second-type semiconductor layer 208 is in direct contact with the light-emitting layer 206. The first-type semiconductor substrate 200, the light-emitting layer 206, and the second-type semiconductor layer 208 are collectively composed of a light-emitting diode (LED) structure 214. In one embodiment, the light-emitting layer 206 may be a semiconductor layer having multiple quantum wells (MQWs). For example, the light-emitting layer 206 may be formed of semiconductor materials including GaN or InGaN. In one embodiment, the second-type semiconductor layer 208 may be a p-type semiconductor layer formed of semiconductor materials including GaN, GaP, GaAsP, AlGaAs, InGaAlP or InGaN.

Figure 3:
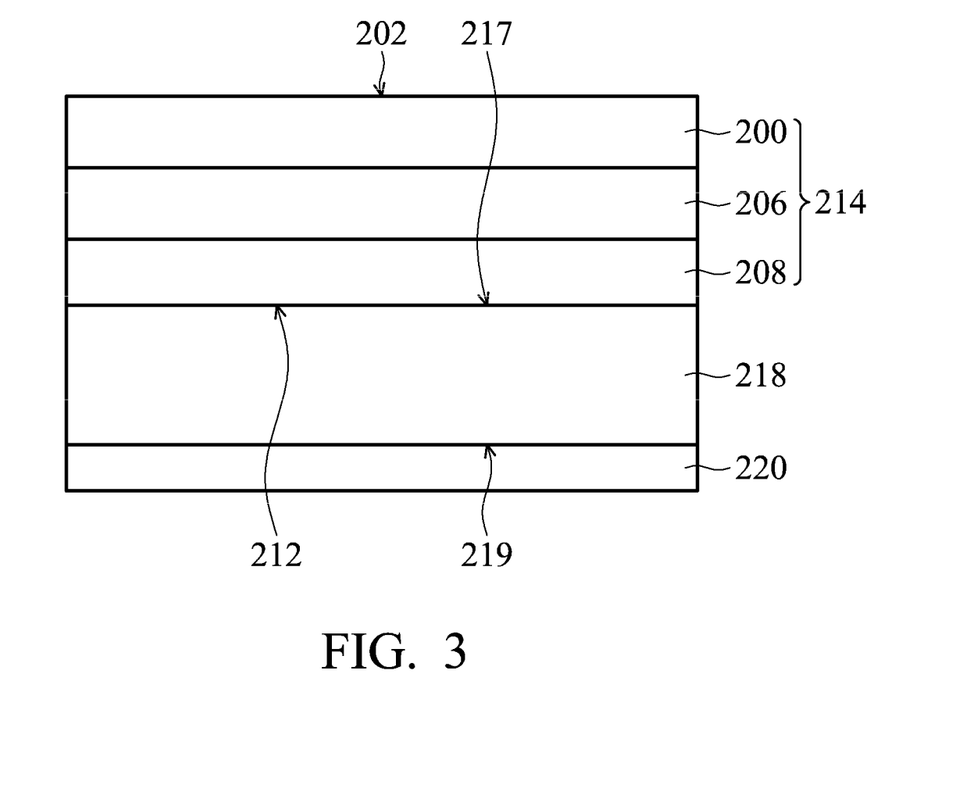

Next, a metal substrate 218 having opposite surfaces 217 and 219 is provided as shown in FIG. 3. In one embodiment, the metal substrate 218 may be a copper substrate. Next, the LED structure 214 is flipped up-side down, so that the first surface 212 of the second-type semiconductor layer 208 faces down. Next, a flip-chip bonding process is performed so that the first surface (top surface) 212 of the second-type semiconductor layer 208 is bonded on the surface 217 of the metal substrate 218. In one embodiment, the LED structure 214 is bonded on the surface 217 of the metal substrate 218 through an adhesion layer (not shown). The adhesion layer may be formed of Sn—Ag alloys, Sn—Cu alloys, Ni—Ag alloys or combinations thereof. Alternatively, a protection layer 220 may be formed on the surface 219, which is opposite to the surface 217, of the metal substrate 218 to protect the metal substrate 218. In one embodiment, the protection layer 220 may be formed of materials including Au.

Figure 4A:
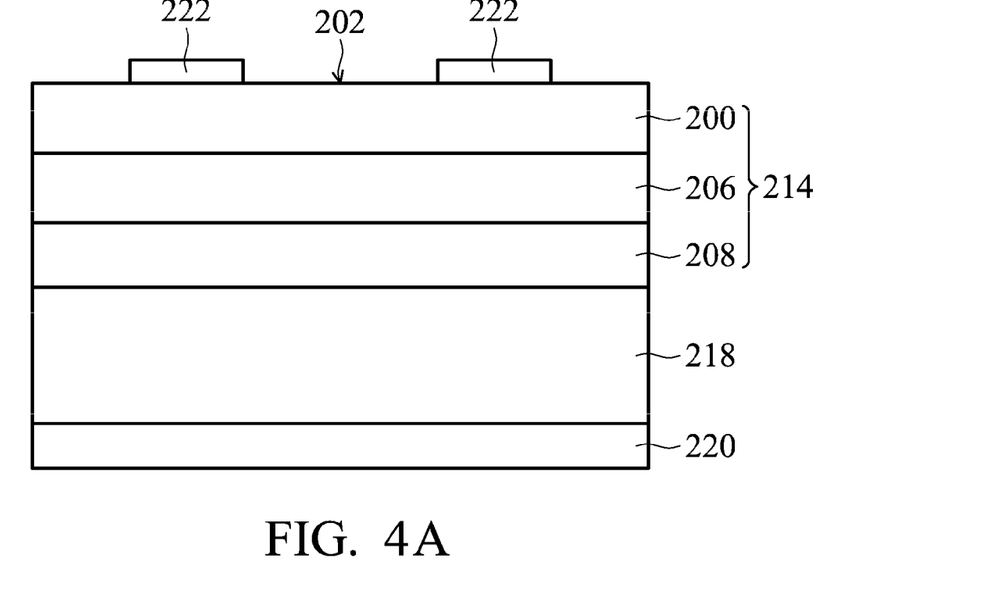
Figure 4B:
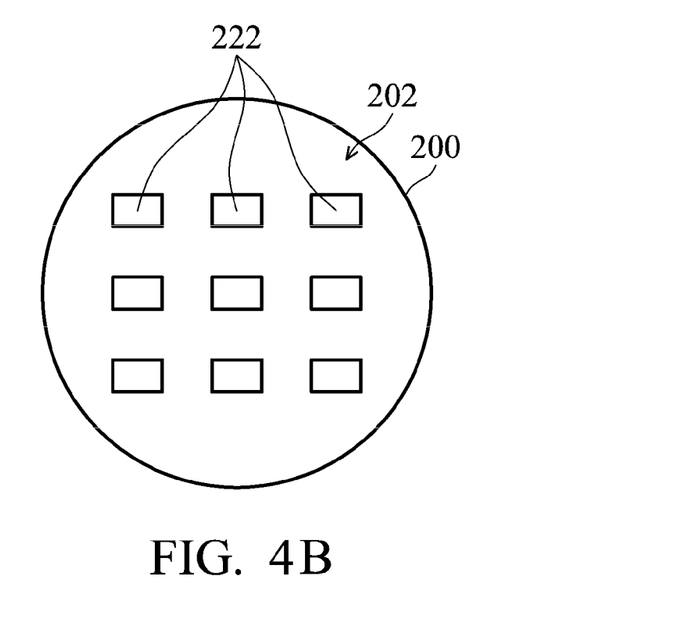
FIGS. 4B and 7B are respective top views of FIGS. 4A and 7A, showing top views of intermediate steps of one embodiment of a method for fabricating a light-emitting diode device of the invention.

Next, a first mask pattern 222 is formed on a portion of the second surface 202 of the first-type semiconductor substrate 200 as shown in FIGS. 4A and 4B. In one embodiment, the first mask pattern 222 may be a photoresist pattern. In one embodiment, the first mask pattern 222 is used to define contact positions on the first-type semiconductor substrate 200 of the LED structure 214. Also, the first mask pattern 222 may prevent the contact positions on the first-type semiconductor substrate 200 from being damaged during the subsequent processes. Therefore, the number of LED devices formed by cutting the LED structure 214 is defined by the number of first mask patterns 222. For example, a number of resulting LED devices is equal to the number of first mask patterns 222. For example, in one embodiment as shown in FIG. 4A, there are nine first mask patterns 222 formed on the first-type semiconductor substrate 200 of the LED structure 214. Therefore, there are nine resulting LED devices formed on the first-type semiconductor substrate 200 of the LED structure 214. However, the number of first mask patterns 222 is not limited, and accordingly to designs of masks for the contacts of the LED devices.

FIGS. 5-9 are used to describe a surface-roughing process. The surface-roughing process is used to increase the light-emitting efficiency of the vertical LED device. In one embodiment, a plurality of metal nano balls, which serve as a mask for a three-dimensional (3D) implantation process, is formed on the LED structure 214 to change the etching rate on surfaces of the LED structure 214 during the subsequent etching process, thereby roughening the surfaces of the LED structure 214.

Figure 5:
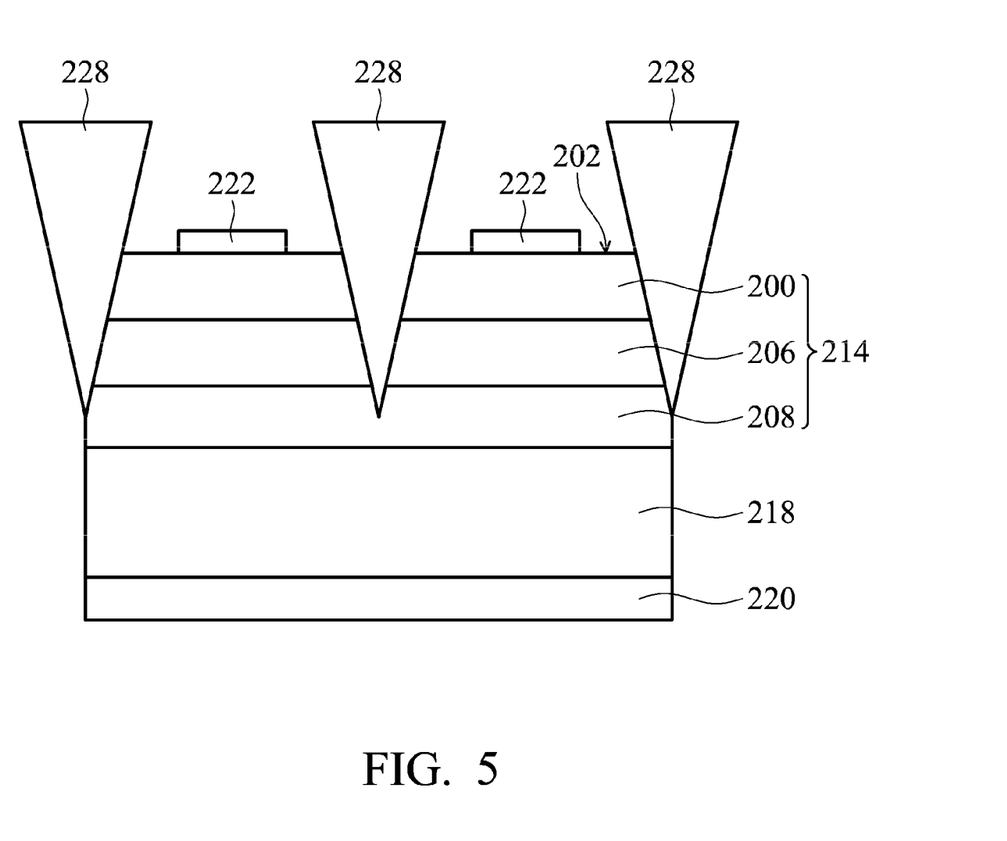

As shown in FIG. 5, a first cutting process 228, such as a laser scribing process, is performed on the second surface 202 of the first-type semiconductor substrate 200 of the LED structure 214 between any two adjacent first mask patterns 222 to remove a portion of the LED structure 214. The first cutting process 228 is used to define the number and size of the LED chips.

Figure 6:
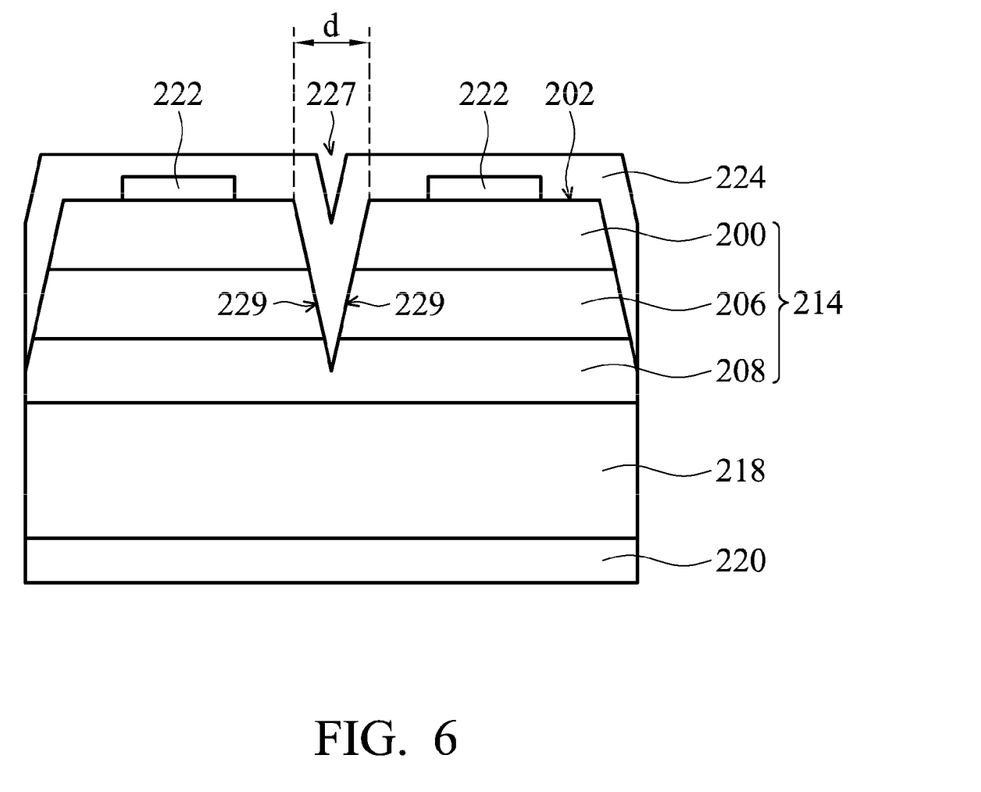

As shown in FIG. 6, after performing the first cutting process 228 (FIG. 5), a scribe line 227 is formed in the LED structure 214 between any two adjacent first mask patterns 222. A width d of the scribe line 227 is from about 10 μm to about 30 μm. For example, the width d of the scribe line 227 is about 20 μm. Next, a thin-film deposition process such as a sputtering process is performed to form a metal film 224 covering the first mask patterns 222 and the second surface 202 of the first-type semiconductor substrate 200 of the LED structure 214. The metal film 224 also conformably covers sidewalls 229 of the scribe line 227. In one embodiment, the metal film 224 may be formed of Ni. The thickness of the metal film 224 may be between about 5 Å and about 200 Å. In one embodiment, the thickness of the deposited metal film 224 defines the size of the subsequent metal nano balls.

Figure 7A:
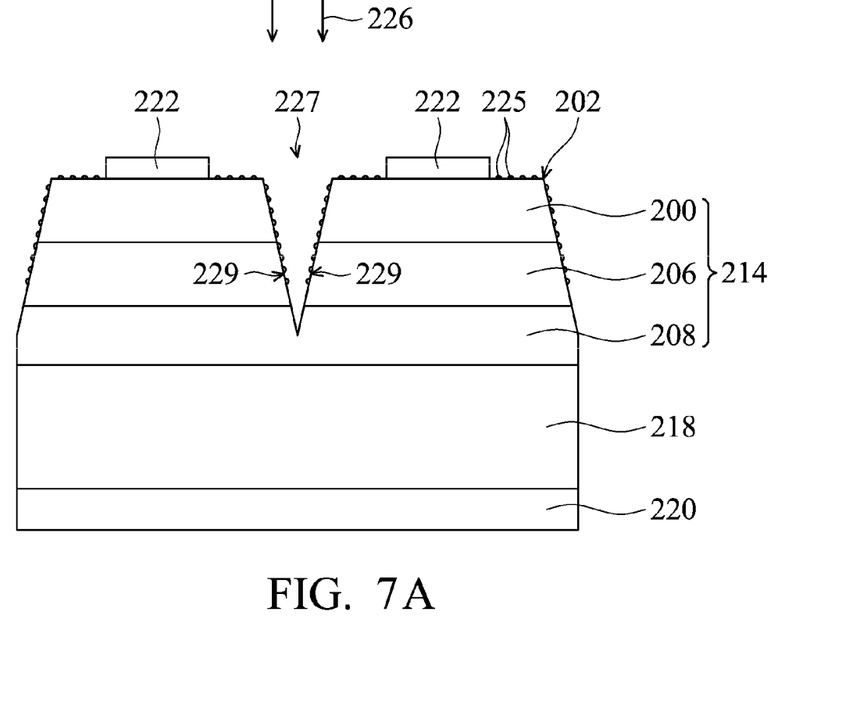
Figure 7B:
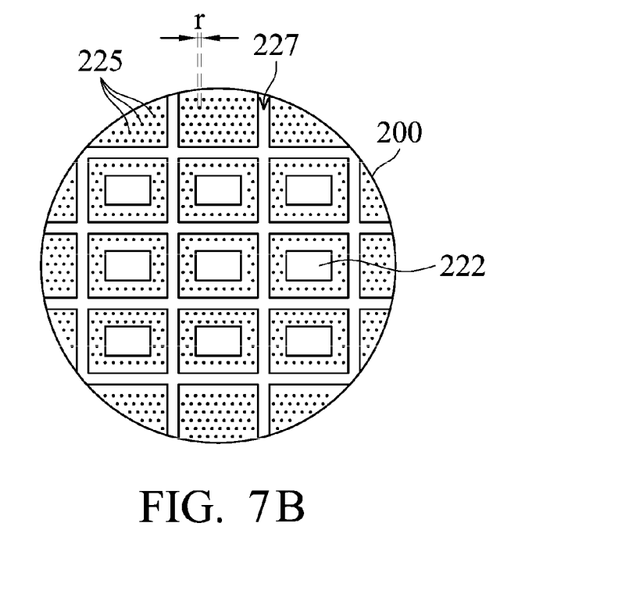

Next, an annealing process 226 is performed so that the metal film 224 is melted and self-assembling into a discontinuous film in nm-scale as shown in FIGS. 7A and 7B. In one embodiment, the annealing process 226 may be a rapid thermal annealing (RTA) process. In one embodiment, the temperature range for the annealing process 226 may be between about 700° C. and about 900° C. Also, a processing time for the annealing process 226 can be designed to be positively correlated to the thickness of the metal film 224. Due to the difference between the coefficients of thermal expansion (CTE) of the melted metal film 224 and the first-type semiconductor substrate 200, the melted metal film 224 is gradually cooled down and then self-assembling into a plurality of metal nano balls 225 on the sidewall 229 of the scribe line 227 after performing the annealing process 226. In one embodiment, a diameter of the metal nano balls 225 is in the nm scale. Therefore, the metal nano balls 225 are formed as a metal discontinuous mask layer only on a portion of the second surface 202 of the first-type semiconductor substrate 200 not covered by the first mask patterns 222. That is to say, other portions of a portion of the second surface 202 of the first-type semiconductor substrate 200 not covered by the first mask patterns 222 are exposed to spaces between the metal nano balls 225. In other embodiments, an insulating film (not shown) may be formed on the first-type semiconductor substrate 200 such as silicon dioxide ($SiO_2$). On the one hand, the insulating film can help to increase an adhesion of the metal film 224, and helps to increase the difference between the coefficients of thermal expansion (CTE) of the melted metal film 224 and the first-type semiconductor substrate 200. On the other hand, the insulating film can protect the LED structure to withstand the subsequent surface-roughing process, thereby increasing the process yield. Therefore, the insulating film can further improve the self-assembling ability of the melted metal film 224 to form the metal nano balls 225 after performing the annealing process 226. In one embodiment, the metal nano balls 225 show a discontinuous distribution (non-periodic distribution).

Figure 8A:
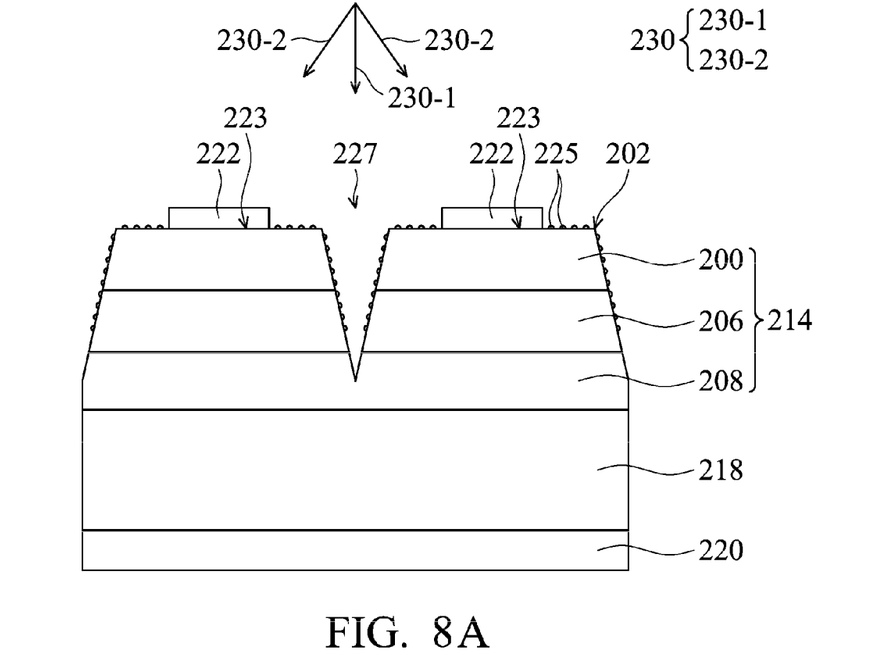
Figure 8B:
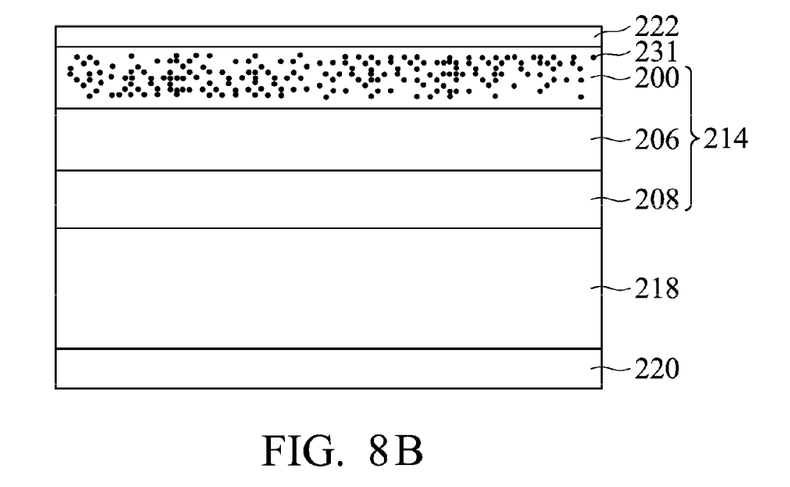
FIG. 8B is a side view along a sidewall of one embodiment of a light-emitting diode device as shown in FIG. 8A, showing a distribution of a dopant in a light-emitting diode chip after performing a three-dimensional implantation process.
Figure 9:
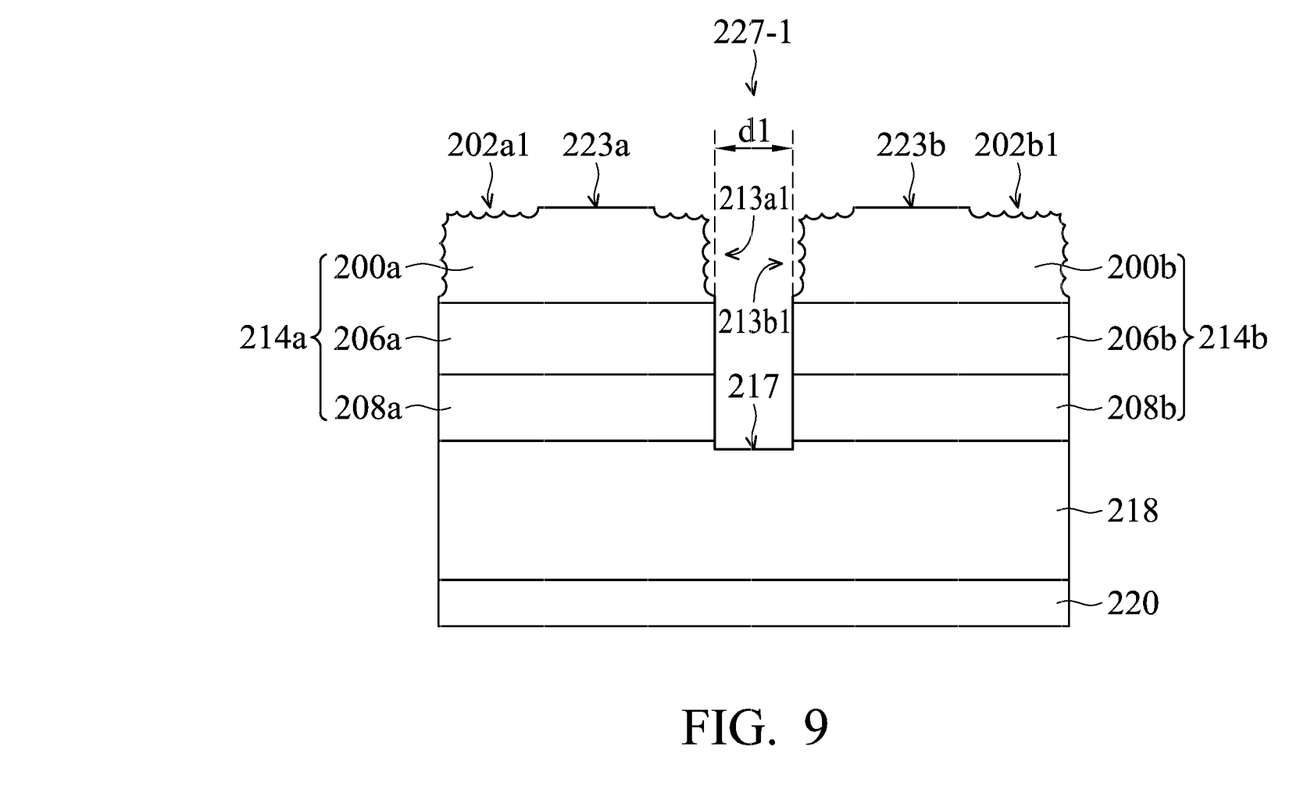

FIGS. 8A, 8B and 9 illustrate a surface-roughing process for the first-type semiconductor substrate 200. Next, as shown in FIGS. 8A and 8B, a three-dimensional (3D) implantation process 230 is performed using the first mask patterns 222 and the plurality of metal nano balls 225 collectively as a mask, so that a dopant 231 is implanted into the first-type semiconductor substrate 200 of the LED structure 214 through the second surface 202 and the sidewalls 229 adjacent to the second surface 202, which are not covered by the first mask patterns 222 and the plurality of metal nano balls 225. In one embodiment, the implantation direction of the 3D implantation process 230 comprises a first direction 230-1 perpendicular to the second surface 202 of the first-type semiconductor substrate 200 and a second direction 230-2. The tilted angle of the second direction 230-2 with respect to the first direction 230-1 is about ±7 degrees to ±20 degrees. Therefore, the dopant 231 is not only implanted from the second surface (top surface) 202 of the first-type semiconductor substrate 200, but also from the sidewall 229 of the scribe line 227 into the first-type semiconductor substrate 200. It should be noted that the 3D implantation process 230 is also called a plasma immersion ion implantation (PIII) process. The PIII process can implant dopants into various surfaces of a workpiece from various directions. The 3D implantation process can change the ion source of the conventional ion implantation equipment as a plasma source disposed in a large chamber. The target is immersed in the plasma, and a negative pulse voltage is applied on the target to generate the plasma, thereby implanting the workpiece from various directions. The 3D implantation process can overcome the limitation of the conventional ion implantation process with only one implantation direction. In one embodiment, a dopant concentration of the 3D implantation process 230 is in a range between about $5 \times 10^{14}$ ions/cm$^{-2}$ and about $5 \times 10^{17}$ ions/cm$^{-2}$. In one embodiment, the dopant 231 is selected from the group consisting of Au+, $O_2$, Ar, $H_2$ and $N_2$. Because the first mask patterns 222 and the plurality of metal nano balls 225 collectively serve as a mask for the 3D implantation process 230, the dopant 231 is not implanted into a portion of the first-type semiconductor substrate 200 which is close to an interface 223 between the conductive patterns 222 and the first-type semiconductor substrate 200. Also, the dopant 231 is not implanted into a portion of the first-type semiconductor substrate 200 which is close to an interface between the metal nano balls 225 and the first-type semiconductor substrate 200.

The method uses the conductive patterns 222 and the metal nano balls 225, which are formed on the top surface (the second surface 202) of the LED structure 214, arranged as a mask for the 3D implantation process, so that the dopant 231 is only implanted into the first-type semiconductor substrate 200 not covered by the conductive patterns 222 and the metal nano balls 225. Compared other portions of the first-type semiconductor substrate 200 without doped by the dopant 231, the portion of the first-type semiconductor substrate 200 doped by the dopant 231 will change its characteristic. Therefore, the etching rate for the subsequent chemical etching process is changed to facilitate performing the subsequent surface-roughing process.

Next, after performing the 3D implantation process 230 as shown in FIG. 8A, a chemical etching process, such as a wet etching process, is performed to remove the conductive patterns 222 and the metal nano balls 225 as shown in FIG. 9. Also, the chemical etching process is then performed to remove a portion of the first-type semiconductor substrate 200, the light-emitting layer 206 and the second-type semiconductor layer 208 from the second surface 202 of the first-type semiconductor substrate 200 and the sidewalls 229 of the scribe line 227, which is adjacent to the second surface 202 (FIG. 8A), until the surface 217 of the metal substrate 218 is exposed as shown in FIG. 9. After performing the chemical etching process, a plurality of LED chips 214a and 214b separated each other by the scribe line 227-1 are formed. In one embodiment, a spacing dl between the LED chips 214a and 214b (i.e. a width of the scribe line 227-1) is in a range between about 5 μm and about 50 μm, such as 20 μm. As shown in FIG. 9, the LED chip 214a includes a first-type semiconductor substrate 200a, a light-emitting layer 206a and a second-type semiconductor layer 208a. The LED chip 214b includes a first-type semiconductor substrate 200b, a light-emitting layer 206b and a second-type semiconductor layer 208b. Also, the chemical etching process roughens second surfaces and sidewalls adjacent to the second surfaces of the first-type semiconductor substrates 200a, 200b of the LED chips 214a, 214b into roughened second surfaces 202a1, 202b1 and roughened sidewalls 213a1, 213b1. The roughened second surfaces 202a1, 202b1 and the roughened sidewalls 213a1, 213b1 damage the total reflection characteristics of the first-type semiconductor substrates 200a, 200b. Therefore, the light generated from the light-emitting layers 206a, 206b will emits easily to increase the light extraction efficiency of the resulting LED device. Because the LED structure 214 as shown in FIGS. 7A and 7B has a tapered structure, the area in a plane view and the width of a cross-sectional view of the first-type semiconductor substrates 200a, 200b of the LED chips 214a, 214b (FIG. 9) are smaller than the area in a plane view and the width of a cross-sectional view of the second-type semiconductor layers 208a, 208b under the first-type semiconductor substrates 200a, 200b. In one embodiment, because the diameter of the metal nano balls 225 (FIG. 8A), which are collectively used as the mask for the 3D implantation process, is in the nm scale, and the surface roughness (Ra) of the roughened second surfaces 202a1, 202b1 and the roughened sidewalls 213a1, 213b1 is controlled to be less than about 600 nm. In one embodiment, because the metal nano balls 225 (FIG. 8A), which are collectively used as the mask for the 3D implantation process, show a discontinuous distribution (non-periodic distribution), the spacing between the two adjacent metal nano balls 225 is in a range between about 40 nm and about 100 nm. Therefore, the roughened second surfaces 202a1, 202b1 and the roughened sidewalls 213a1, 213b1 may be discontinuous concave-convex roughened surfaces to further improve the light extraction efficiency of the resulting LED device. In one embodiment, the space between the concave portion to the convex portion, which is adjacent to the concave portion, of the discontinuous concave-convex roughened surfaces can be in a range between about 40 nm and about 100 nm. The range of the space between the concave portion to the convex portion is almost the same as the period of the metal nano balls 225 (FIG. 8A). It should be noted that interfaces 223a, 223b between the conductive patterns 222 (FIG. 8A) and the first-type semiconductor substrates 200a, 200b (FIG. 9), which are not subjected to the surface-roughing process, are substantially planar surfaces. Therefore, a surface roughness (Ra) of the interfaces 223a, 223b is less than that of the roughened second surfaces 202a1, 202b1 and the roughened sidewalls 213a1, 213b1.

Figure 10:
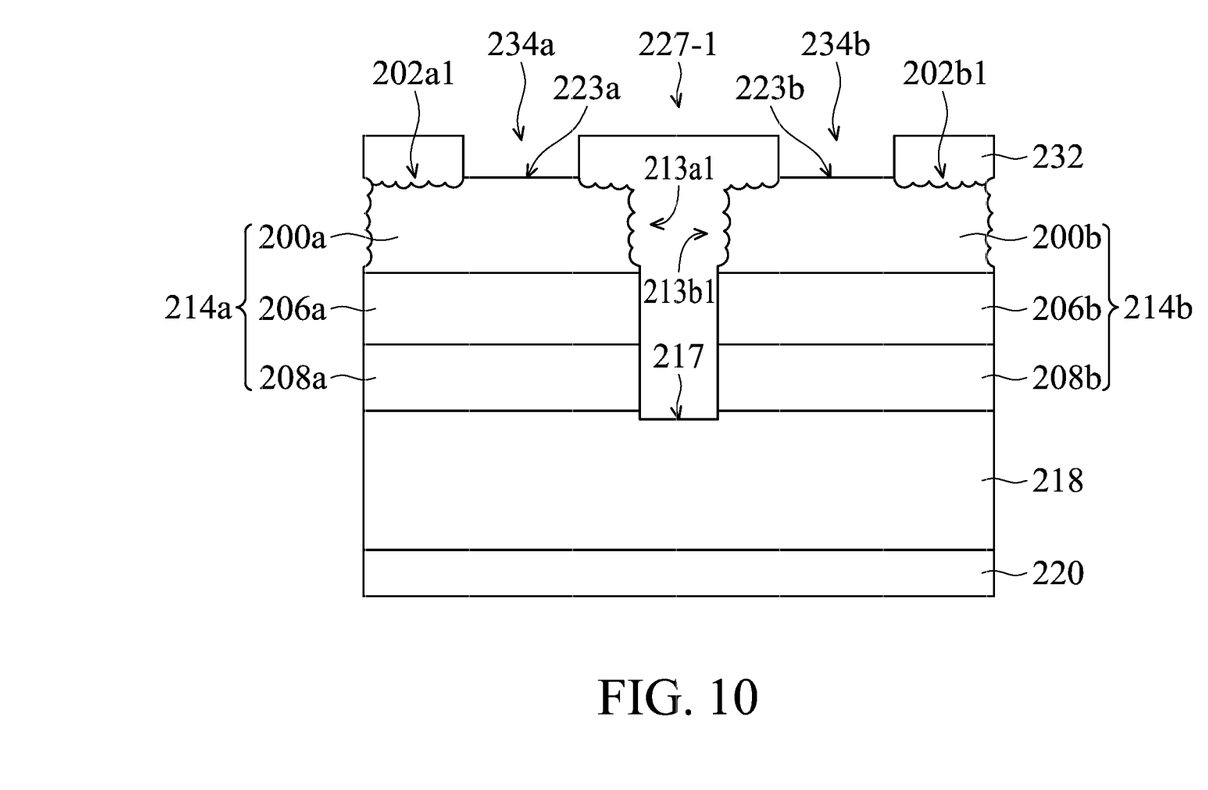

FIGS. 10-12A and 12B are used to describe the formation of a contact electrode for the first-type semiconductor substrates 200a and 200b of the LED chips 214a and 214b. As shown in FIG. 10, a second mask pattern 232 is formed covering the roughened second surfaces 202a1, 202b1 of the first-type semiconductor substrates 200a and 200b of the LED chips 214a and 214b. Also, the second mask pattern 232 fills the scribe line 227-1. In one embodiment, the second mask pattern 232 may be a photoresist pattern. As shown in FIG. 10, the second mask pattern 232 has openings 234a and 234b respectively on the LED chips 214a and 214b. In one embodiment, the positions where the openings 234a and 234b are formed correspond to the formation position of the first mask pattern 222 (FIG. 4A), which is used to define the contact position of the first-type semiconductor substrates 200 of the LED structure 214 (FIG. 4A). Therefore, portions of the second surface, which are close to the interfaces 223a, 223b between the conductive patterns 222 (FIG. 8A) and the first-type semiconductor substrates 200a, 200b (FIG. 9), are exposed to the openings 234a and 234b.

Figure 11:
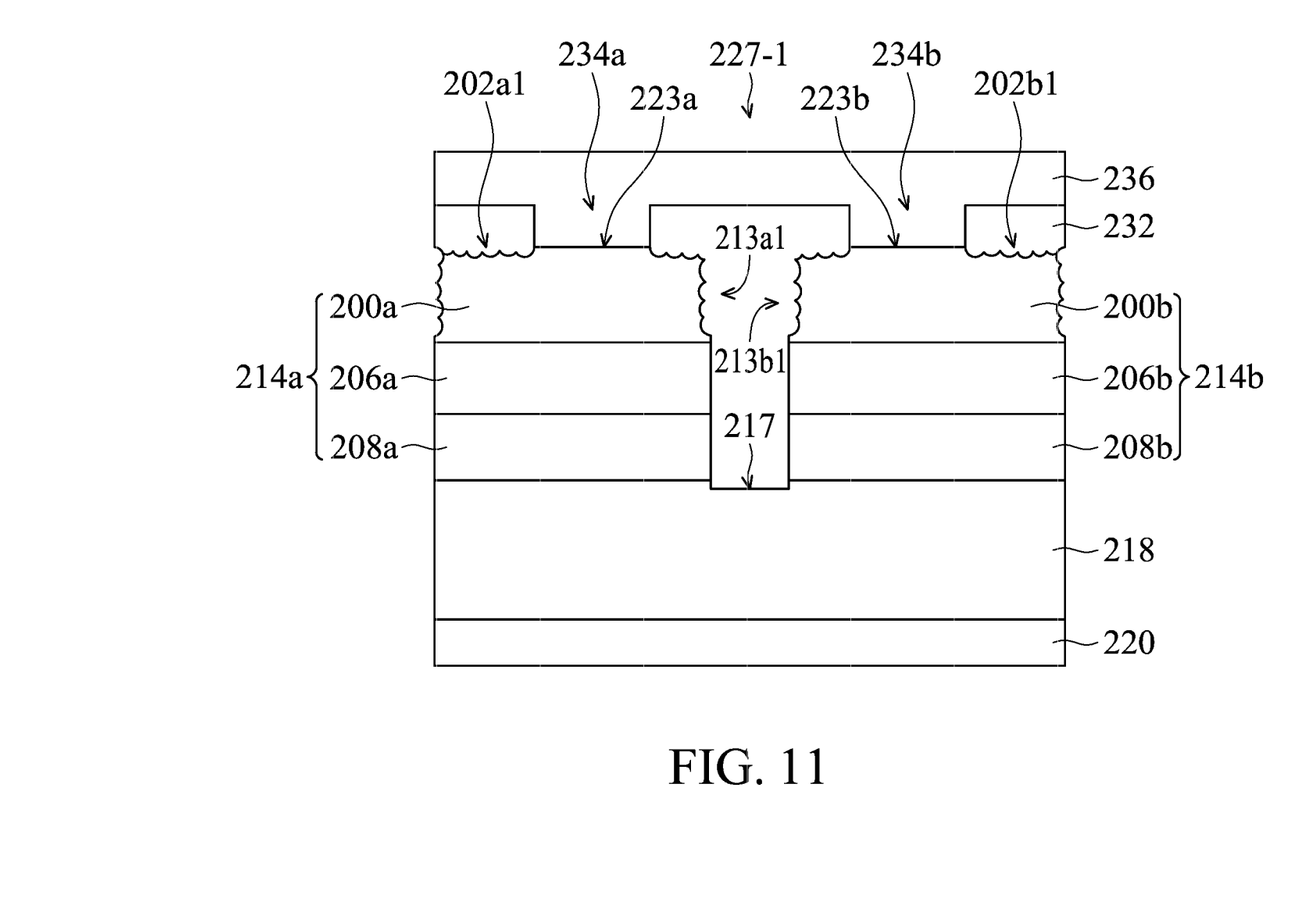

Next, a deposition process, such as an electroplating process, is performed to fill a conductive material 236 into the opening 234a and 234b of the second mask pattern 232 as shown in FIG. 11. In one embodiment, the conductive material 236 fully fills the opening 234a and 234b and covers the top surface of the second mask pattern 232. In one embodiment, the conductive material 236 may be formed of Cu, Au, Ag or other metal composite materials.

Figure 12A:
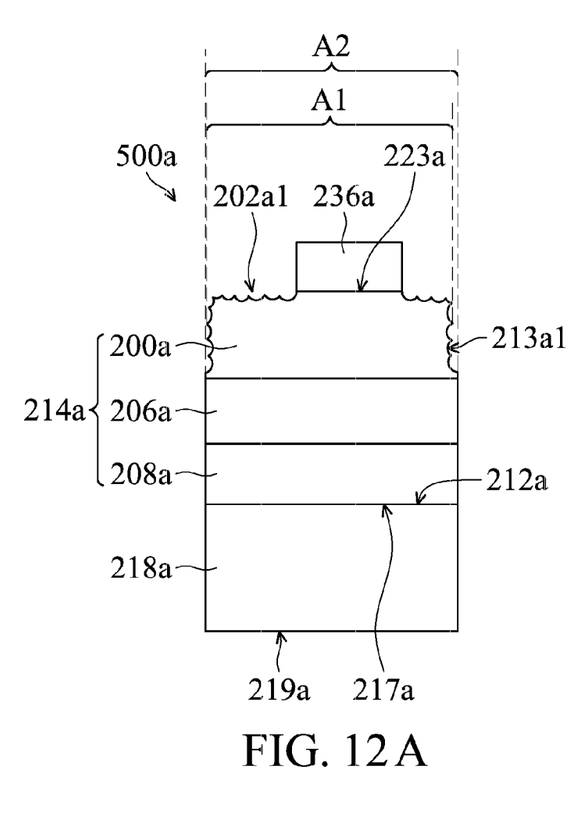
Figure 12B:
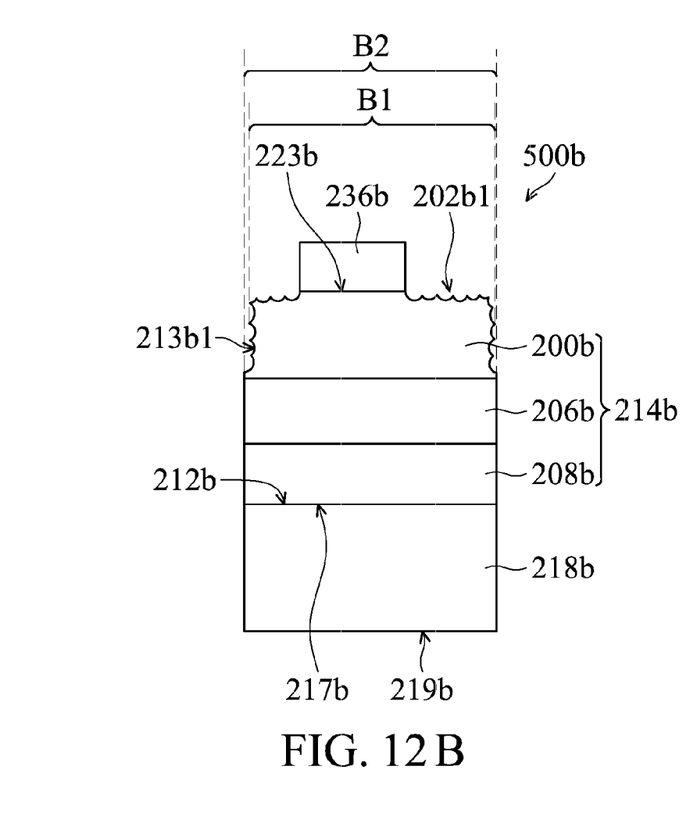

Next, a portion of the conductive material 236 (FIG. 11) is removed until the top surface of the conductive material 236 is substantially aligned to a top surface of the second mask pattern 232 (FIG. 11). Therefore, conductive patterns 236a and 236b are formed on the portions of the second surface, which are close to the interfaces 223a, 223b between the conductive patterns 222 (FIG. 8A) and the first-type semiconductor substrates 200a, 200b (FIG. 9) as shown in FIGS. 12A and 12B. Because the portions of the second surface are not doped by the dopant during the 3D implantation process, the portions of the second surface are substantially planar surfaces without being roughened to the subsequent chemical etching process. Therefore, the electrical performance of the conductive patterns 236 and 236b does not suffer because of the planar portions of the second surface. Next, a lift-off process is used to remove the second mask pattern 232 as shown in FIG. 11. Also, any possible conductive material 236 covering the second mask pattern 232 is also removed. Next, a second cutting process, such as a laser cutting process, is performed along the scribe line 227-1 between the LED chips 214a and 214b to cut off the metal substrate 218. The LED chips 214a and 214b are divided from each other after performing the second cutting process is performed. After the aforementioned processes, vertical LED devices 500a and 500b individual from each other are completely formed.

As shown in FIG. 12A, one embodiment of the LED device 500a includes a metal substrate 218a and a light-emitting diode (LED) structure 214a bonded on the metal substrate 218a. The LED structure 214a includes a first-type semiconductor layer 200a, a second-type semiconductor layer 208a and a light-emitting layer 206a. The second-type semiconductor layer 208a has a first surface 212a and a second surface 210a opposite to the first surface 212a. The first surface 212a is in contact with a surface 217a of the metal substrate 218a. The light-emitting layer 206a is disposed between the first-type semiconductor layer 200a and the second-type semiconductor layer 208a. A portion of the second surface 202a1 and a sidewall 213a1 adjacent to the second surface 202a1 are concave-convex roughened surfaces. Similarly, as shown in FIG. 12A, one embodiment of the LED device 500b includes a metal substrate 218b and a light-emitting diode (LED) structure 214b bonded on the metal substrate 218b. The LED structure 214b includes a first-type semiconductor layer 200b, a second-type semiconductor layer 208b and a light-emitting layer 206b. The second-type semiconductor layer 208b has a first surface 212b and a second surface 210b opposite to the first surface 212b. The first surface 212b is in contact with a surface 217b of the metal substrate 218b. The light-emitting layer 206b is disposed between the first-type semiconductor layer 200b and the second-type semiconductor layer 208b. A portion of the second surface 202b1 and a sidewall 213b1 adjacent to the second surface 202b1 are concave-convex roughened surfaces. Additionally, a width A1 of the first-type semiconductor layer 200a of the LED device 500a is smaller than a width A2 of the second-type semiconductor layer 208a of the LED device 500a in a cross-sectional view. Similarly, as shown in FIG. 12B, the width B1 of the first-type semiconductor layer 200b of the LED device 500b is smaller than a width B2 of the second-type semiconductor layer 208b of the LED device 500b in a cross-sectional view.

Embodiments of a light-emitting diode (LED) device and a method for fabricating the same have the following advantages. The LED device uses a fabricated n-type semiconductor (e.g. GaN) substrate to replace the conventional sapphire substrate, which is provided for an LED structure formed by an epitaxy process. A light-emitting layer and a p-type semiconductor layer can be formed directly on the fabricated n-type semiconductor to form a vertical LED structure. Compared with the conventional vertical LED structure, a lattice constant of the fabricated n-type semiconductor substrate substantially match with that of the light-emitting layer and the p-type semiconductor layer. Therefore, an un-doped semiconductor layer is not required to be epitaxialy grown on the n-type semiconductor substrate for the goal of lattice constant matching. Embodiments of the LED device will have excellent epitaxy quality and internal quantum efficiency. Compared with the conventional vertical LED structure, embodiments of the LED device are fabricated without using any sapphire substrate, so that a lift-off process to lift off the sapphire carrier is not required. Therefore, embodiments of the vertical LED device has improved fabrication yield and reduced cost. Also, the LED device uses a fabricated n-type semiconductor substrate but not a semiconductor substrate grown by an epitaxy process. Therefore, the n-type semiconductor substrate can be design having a large thickness of about 2 um to about 300 um. Further, the n-type semiconductor substrate having a thick thickness will increase a process window of a surface roughen process performed on at least five surfaces, which includes four sidewalls and a top surface used for an n-type contact, of the n-type semiconductor substrate. Therefore, the light extraction efficiency of the resulting LED device is increased. Moreover, the method uses metal nano balls arranged as an mask for a three-dimensional (3D) implantation process and a chemical etching process to perform a surface-roughing process for the at least five surfaces, which includes the four sidewalls and the top surface used for an n-type contact, of the n-type semiconductor substrate. Therefore, the light-emitting efficiency of the resulting LED device is increased. Also, because the diameter of the metal nano balls, which are collectively used as the mask for the 3D implantation process, is in the nm scale, the surface roughness (Ra) of the roughened surfaces is controlled less than about 600 nm. Additionally, because the metal nano balls, which are collectively used as the mask for the 3D implantation process, show a discontinuous distribution (non-periodic distribution). The roughened surfaces are discontinuous concave-convex roughened surfaces. The space between the concave portion and the convex portion, which is adjacent to the concave portion, of the discontinuous concave-convex roughened surfaces is almost the same as the period of the metal nano balls. The discontinuous concave-convex roughened surfaces may further improve the light extraction efficiency of the resulting LED device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a light-emitting diode device, comprising:
    providing a first-type semiconductor substrate having a first surface and a second surface opposite to the first surface;
    growing a light-emitting layer and a second-type semiconductor layer on the first surface of the first-type semiconductor substrate in sequence to form a light-emitting diode structure;
    providing a metal substrate for the light-emitting diode structure to bond on through the second-type semiconductor layer;
    forming a first mask pattern on a portion of the second surface of the first-type semiconductor substrate;
    forming a plurality of metal nano balls on the second surface of the first-type semiconductor substrate not covered by the first mask pattern;
    performing a three-dimensional implantation process using the first mask pattern and the plurality of metal nano balls collectively as a mask, so that a dopant is implanted into the first-type semiconductor substrate through the second surface and a sidewall adjacent to the second surface, which are not covered by the first mask pattern and the plurality of metal nano balls;
    removing the first mask pattern and the plurality of metal nano balls; and
    forming a conductive pattern on the second surface of the first-type semiconductor substrate.

2. The method for fabricating a light-emitting diode device as claimed in claim 1, wherein forming the plurality of metal nano balls comprises:
    forming a metal film covering the first mask pattern and the second surface; and
    performing an annealing process to melt the metal film, so that the plurality of metal nano balls is formed on the second surface.

3. The method for fabricating a light-emitting diode device as claimed in claim 2, further comprising:
    performing a chemical etching process to roughen the second surface and the sidewall adjacent to the second surface, which are not covered by the first mask pattern and the plurality of metal nano balls, as a roughened second surface and a roughened sidewall after performing the three-dimensional implantation process.

4. The method for fabricating a light-emitting diode device as claimed in claim 1, further comprising:
    performing a first cutting process to remove a portion of the light-emitting diode structure until the metal substrate is exposed, so that a plurality of light-emitting diode chips separated from each other is formed on the metal substrate before performing the three-dimensional implantation process.

5. The method for fabricating a light-emitting diode device as claimed in claim 1, wherein forming the conductive pattern comprises:
    forming a second mask pattern covering the second surface, wherein the second mask pattern has an opening, and a portion of the second surface is exposed to the opening;
    filling a conductive material into the opening; and
    removing the second mask pattern.

6. The method for fabricating a light-emitting diode device as claimed in claim 1, wherein a formation position of the conductive pattern is the same as that of the first mask pattern.

7. The method for fabricating a light-emitting diode device as claimed in claim 1, wherein the dopant is not implanted into a portion of the first-type semiconductor substrate which is close to an interface between the conductive pattern and the first-type semiconductor substrate.

8. The method for fabricating a light-emitting diode device as claimed in claim 4, further comprising:
    performing a second cutting process on the exposed metal substrate to remove a portion of the light-emitting diode structure to divide the plurality of light-emitting diode chips separated from each other into individual light-emitting diode chips before performing the three-dimensional implantation process.

9. The method for fabricating a light-emitting diode device as claimed in claim 1, wherein an implantation direction of the three-dimensional implantation process comprises a first direction perpendicular to the second surface and a second direction having a tilted angle with respect to the first direction of about ±7 degrees to ±20 degrees.

10. The method for fabricating a light-emitting diode device as claimed in claim 1, wherein the dopant is selected from a group consisting of Au+, $O_2$, Ar, $H_2$ and $N_2$.

11. The method for fabricating a light-emitting diode device as claimed in claim 1, wherein a dopant concentration of the three-dimensional implantation process is in a range between about $5\times10^{14}$ ions/cm$^{-2}$ and about $5\times10^{17}$ ions/cm$^{-2}$.

12. The method for fabricating a light-emitting diode device as claimed in claim 3, wherein a surface roughness (Ra) of the roughened second surface and the roughened sidewall is less than about 600 nm.

13. The method for fabricating a light-emitting diode device as claimed in claim 12, wherein the roughened second surface and the roughened sidewall are discontinuous concave-convex roughened surfaces, wherein a space between a concave portion to a convex portion of the discontinuous concave-convex roughened surfaces is in a range between about 40 nm and about 100 nm.

14. A light-emitting diode device, comprising:
a metal substrate; and
a light-emitting diode structure bonded on the metal substrate, wherein the light-emitting diode structure comprises:
a first-type semiconductor layer having a first surface and a second surface opposite to the first surface;
a second-type semiconductor layer being in contact with the metal substrate; and
a light-emitting layer disposed between the first-type semiconductor layer and the second-type semiconductor layer;
wherein a portion of the second surface and a sidewall adjacent to the second surface are concave-convex roughened surfaces, and
wherein the portion of the second surface and the sidewall are discontinuous concave-convex roughened surfaces, wherein a space between a concave portion to a convex portion of the discontinuous concave-convex roughened surfaces is in a range between about 40 nm and about 100 nm.

15. The light-emitting diode device as claimed in claim 14, wherein a width of the first-type semiconductor layer is smaller than that of the second-type semiconductor layer in a cross-sectional view.

16. The light-emitting diode device as claimed in claim 15, wherein the light-emitting diode structure comprises a conductive pattern formed on the second surface of the first-type semiconductor substrate.

17. The light-emitting diode device as claimed in claim 16, wherein an interface between the conductive pattern and the second surface is a planar surface and a surface roughness (Ra) of the interface is smaller than that of the portion of the second surface and the sidewall.

18. The light-emitting diode device as claimed in claim 14, wherein a surface roughness (Ra) of the portion of the second surface and the sidewall is less than about 600 nm.

* * * * *